United States Patent [19]

Hartman et al.

[11] 4,313,125

[45] Jan. 26, 1982

[54] LIGHT EMITTING SEMICONDUCTOR DEVICES

[75] Inventors: Robert L. Hartman, Warren Township, Somerset County; Louis A. Koszi, Scotch Plains; Norman E. Schumaker, Warren Township, Somerset County, all of N.J.

[73] Assignee: Bell Telephone Laboratories, Incorporated, Murray Hill, N.J.

[21] Appl. No.: 50,637

[22] Filed: Jun. 21, 1979

[51] Int. Cl.³ .................... H01S 3/18; H01S 3/19
[52] U.S. Cl. ...................... 357/17; 331/94.5 H; 357/16
[58] Field of Search ............... 331/94.5 H; 357/16–18

[56] References Cited

U.S. PATENT DOCUMENTS 4,184,170  1/1980  Burnham et al. ................. 357/17

OTHER PUBLICATIONS

D. V. Lang et al., "Capacitance Spectroscopy Studies of Degraded $Al_xGa_{1-x}As$ DH Stripe-Geometry Lasers", J. of Applied Physics, vol. 47, No. 11, Nov. 1976, pp. 4986 and 4987.
T. Kobayashi, "Recombination-Enhanced Annealing Effect of AlGaAs-GaAs Remote Junction Heterostructure Lasers", IEEE Quantum Electronics Conference, Sep. 1978.
K. Kobayashi et al., "Unstable Horizontal Transverse Modes and Their Stabilization with a New Stripe Structure", IEE J. of Quantum Electronics, vol. QE–13, No. 8, Aug. 1977, pp. 659–661.
R. Nelson et al., "Minority-Carrier Lifetime and Internal Quantum Efficiency of Surface-free GaAs", J. of Applied Physics, vol. 49, No. 12, Dec. 1978, pp. 6103–6108.

Primary Examiner—James W. Davie
Attorney, Agent, or Firm—Michael J. Urbano

[57] ABSTRACT

A double heterostructure light emitting semiconductor device is described wherein a narrow bandgap active region is sandwiched between two wider bandgap cladding layers, one of which contains a p-n homojunction. The purpose is to separate the p-n junction from the active region and, thus, to have the active region bounded by two isotype (p-p or n-n) heterojunctions. This configuration significantly reduces nonradiative interface recombination current which occurs principally at the anisotype (p-n) heterojunction in a standard double heterostructure.

9 Claims, 3 Drawing Figures

LIGHT EMITTING SEMICONDUCTOR DEVICES

BACKGROUND OF THE INVENTION

1. Field of the Invention

This invention relates to double heterostructure (DH) light emitting diodes, and more particularly, to DH junction lasers and spontaneous emission diodes wherein the p-n junction is separated from the active region.

2. Description of the Prior Art

The advancement of optical communications technology depends on the development of inexpensive and reliable components. A major breakthrough in this technology was the development of semiconductor DH junction lasers for use as signal generators. The DH laser structure, which basically comprises a narrow bandgap active region sandwiched between relatively wider bandgap, lattice-matched cladding layers, brought about a dramatic decrease in the laser oscillation initiation current (threshold) which made CW operation at room temperature possible. The success of the DH structure is due to confinement of light and carriers perpendicular to the junction plane by the heterojunctions formed at the interfaces between the narrow and the wide bandgap layers. Various device structures have been proposed which enable lateral control of carriers and light in a direction parallel to the junction plane. These structures further reduce threshold current and are often conducive to oscillation in the lower order modes.

Referring to FIG. 1, an illustrative prior art $Al_xGa_{1-x}As$ ($0 < X < 1$) DH structure 5 is shown along with a bandgap energy diagram corresponding to the composition of each layer. When cladding layers 2 and 3 are forward biased and current is applied greater than the lasing threshold, electrons are injected from the wide bandgap n-ternary cladding layer 2 into the lower bandgap p-binary active region 1 where they recombine radiatively with holes to produce stimulated emission at a wavelength approximately equal to the bandgap energy of the material in active region 1. The bandgap difference at heterojunctions 6 and 7 creates a potential barrier which confines electrons to active region 1. Stimulated light is confined by virtue of the index of refraction discontinuity between cladding layers 2 and 3 and active region 1. The index of the binary active region material is greater than the index of the ternary material of cladding layers 2 and 3, thus, active region 1 guides the stimulated light.

Heterojunctions 6 and 7 should have as few defects as possible since such defects act as nonradiative recombination centers and tend to reduce efficiency and increase lasing thresholds. One way of improving the quality of the heterojunctions has been by lattice-matching the materials. One reason why the $Al_xGa_{1-x}As$-GaAs system has been so intensively studied is that the lattice constants for $Al_xGa_{1-x}As$ and GaAs are approximately equal for all values of x. Thus, high quality heterojunctions can be formed.

Despite the quality of the heterojunctions, however, there are other sources of nonradiative recombination such as bulk nonradiative current, mirror current, and interface recombination current which may affect the threshold current. Referring to FIG. 1, active region 1 of the prior art DH structure has two interfaces (6 and 7) at which nonradiative recombination occurs, i.e., one p-n heterojunction 6 known as an anisotype heterojunction and one p-p (or n-n) heterojunction 7 known as an isotype heterojunction. The interface recombination current occurring at these heterojunctions represents carriers lost to the light producing process. Furthermore, it may also have an effect on laser degradation. We have found that the interface recombination current occurring at the anisotype heterojunction is several times greater than at the isotype.

SUMMARY OF THE INVENTION

Thus, we have found that a structure wherein the p-n junction is displaced from the active region so that the active region is bounded by two isotype (either p-p or n-n) heterojunctions is highly efficient and has a lower threshold current. Briefly, the device comprises a semiconductor body, a wide bandgap first cladding layer disposed on the semiconductor body which contains a p-n homojunction less than a diffusion length of minority carriers away from the active region, a narrower bandgap active region, and a wider bandgap third cladding layer disposed on the active region. A further advantage is obtained by bounding the active region with p-p isotype heterojunctions so that n-ternary material is remote from the active region since $Al_xGa_{1-x}As$ n-ternary is known to have the highest measured concentration of defects in this material system.

BRIEF DESCRIPTION OF THE DRAWING

The invention, together with its various features and advantages, can be more easily understood from the following more detailed description taken in conjunction with the accompanying drawing in which.

DETAILED DESCRIPTION

Figure 3:
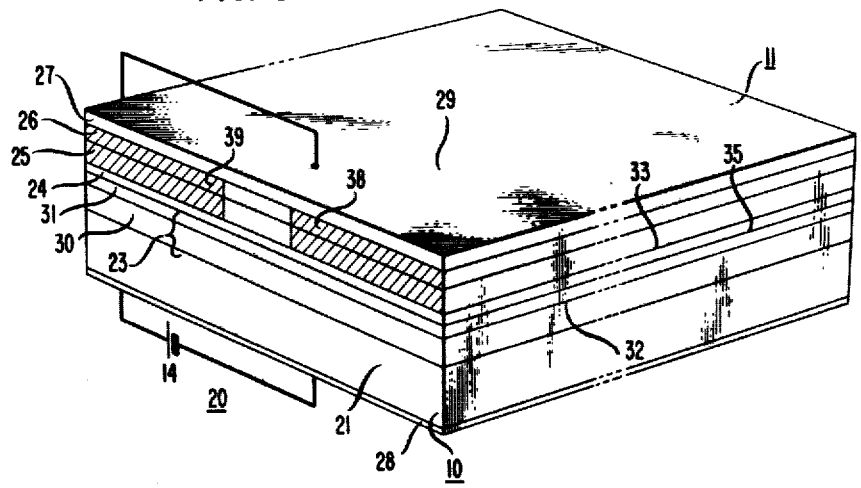
FIG. 3 is an illustrative embodiment of the invention.

Turning now to the drawing, an illustrative embodiment of a DH light emitting diode according to the invention is shown in FIG. 3. The term light emitting diode is used to refer to both a laser diode and a spontaneously emitting diode (LED). However, the discussion will mainly be directed to a laser diode. FIG. 3 shows a DH structure which is illustratively a proton bombarded stripe geometry laser. The DH laser 20 basically comprises a single crystal substrate (semiconductor body) 21 on which are epitaxially grown, of lattice-matched material, a wide bandgap first cladding layer 23 having a p-n homojunction 32 therein at the interface of opposite conductivity-type layers 30 and 31, a narrower bandgap active region 24, and a wide bandgap second cladding layer 25. A capping layer 26 is optionally included to facilitate contact metallization.

Layers 30 and 31 constituting first cladding layer 23 are of opposing conductivity types and form a p-n homojunction 32 therebetween. Active region 24 is of the same conductivity type as cladding layer 25 and layer 31. Therefore, heterojunctions 35 and 33 which are formed at the interface between active region 24 and layers 31 and 25 are isotype heterojunctions, e.g., either p-p or n-n. Heterojunctions 33 and 35 confine light and carriers in the dimension perpendicular to the junction plane. When p-n junction 32 is forward biased above the lasing threshold by means of source 14 connected between the ohmic contacts 28 and 29, minority carriers diffuse through layer 31 into active region 24 where recombination of holes and electrons takes place. Illustratively, proton bombarded regions 38 and 39, which extend near to or through cladding layer 25, confine pumping current in a relatively narrow channel traverse to the layers in order to reduce threshold current. Other current confining configurations, such as oxide stripe, buried double heterostructure, or mesa stripe could be used. Heat sink means (not shown) are generally attached to contact 29.

Opposite end surfaces 10 and 11 are typically cleaved facets formed parallel to one another and perpendicular to the layers to define an optical resonator cavity. The cleaved facets are partially transmissive to permit output of a portion of the radiation from the resonator. Alternatively, in an integrated optical circuit, one or both mirrors could be formed instead by distributed feedback means such as diffraction gratings.

For purposes of illustration, laser 20 is fabricated from lattice-matched $Al_xGa_{1-x}As$-GaAs as follows: An n-GaAs (100)-oriented substrate 21, an $Al_wGa_{1-w}As$ ($0.24 \leqslant w \leqslant 0.36$) first cladding layer 23 containing n-doped layer 30 and p-doped layer 31 forming p-n homojunction 32 therebetween, a $p-Al_yGa_{1-y}As$ ($0 \leqslant y \leqslant 0.1$) active region 24, a $p-Al_zGa_{1-z}As$ ($0.24 \leqslant z \leqslant 0.36$) second cladding layer 25, and a $p^+$-GaAs capping layer 26.

Figure 2:
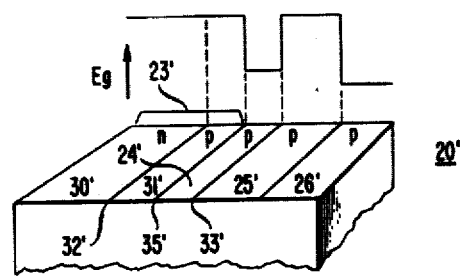

To further exemplify the operation of the novel structure, FIG. 2 shows a bandgap energy diagram corresponding to the layer composition of DH structure 20 of FIG. 3. The reference numerals of FIG. 2 are the primes of their counterparts in FIG. 3. When p-n homojunction 32' is forward biased and current is applied above the lasing threshold, electrons are injected from layer 30' into layer 31' and diffuse across wide bandgap layer 31' into the potential well created by narrow bandgap active region 24' where they radiatively recombine with holes. Therefore, the thickness of layer 31' should be less than, and preferably much less than, the diffusion length of minority carriers so that the carriers recombine in the active region rather than in the layer 31'.

Bulk diffusion length is a function of numerous parameters including material composition, carrier concentration, and operating temperature. High radiative recombination efficient material will exhibit an effective diffusion length which is much greater than the actual electron-hole diffusion length due to photon recycling effects. Photon recycling occurs when a photon is reabsorbed and stimulates the creation of a new electronhole pair. There are also large surface and interface effects which have made the measurement of bulk diffusion length difficult. Thus, while the bulk diffusion length for $Al_xGa_{1-x}As$ has not been completely determined, two workers in the field provided an indication that it is $\geqslant 1$ μm. See T. Kuriyama et al, *Japanese J.A.P.*, Vol. 16, p. 465 (1977); V. Y. Rogulin et al, *Sov. Phys. Semi.*, Vol. 7, p. 1221 (1974). Therefore, a p-n junction located exterior to the active region can inject minority carriers into an active region located $\leqslant 1$ μm away. We have fabricated our devices so that minority carriers travel a distance of between 0.2 and 0.3 μm through layer 31 from p-n junction 32 to active region 24. Furthermore, surface effects at the interfce between cladding layer 31 and active region 24 are minimized by the isotype boundary.

Referring back to FIG. 2, active region 24' is bounded by two heterojunctions, 33' and 35', which confine light and carriers in a direction perpendicular to the junction plane. Nonradiative recombination occurs at heterojunctions due to interface recombination currents. The thickness of the active region for a DH laser is typically $\leqslant 1$ μm for CW operation at room temperature. Preferably, the range is between about 0.15 μm and 0.2 μm for low threshold devices. In lasers having such thin active regions, the loss can be significant because of the large surface to volume ratio. Since we have found that the anisotype interface recombination current is several times larger than the isotype interface recombination current, device 20', wherein active region 24' is bounded by two isotype heterojunctions 33' and 35', is a more efficient device and has a lower threshold than the prior art DH shown in FIG. 1.

In a preferred embodiment, active region 24 and layer 31 are doped p-type so that active region 24 is displaced from n-type material. The n-ternary where $x > 0.20$ is known to have the highest measured concentration of defects in the $Al_xGa_{1-x}As$ material system. In particular, these defects are $D_x$ centers which may be responsible for dark line defects and other forms of slow degradation defects in lasers.

In addition to DH laser structures, spontaneous emitting diodes (LEDs) can also be fabricated. The LED structure would be similar to the laser structure except that the active layer is usually thicker and an optical resonator is not required. When the p-n junction of an LED is forward biased, minority carriers are injected into the active region where they undergo radiative recombination and generate spontaneous emission but not stimulated emission. The structure may be such that there is edge emission as in a laser, or broad area emission through the cladding either by use of an annular contact and/or by etching a hole through the substrate as in a Burrus-type structure. LEDs fabricated by the principles of the invention were found to have a quantum efficiency that ranged from several times to more than an order of magnitude greater than the best standard DH structure fabricated to date.

EXAMPLES

In an illustrative example, we fabricated a DH laser according to the invention as shown in FIG. 3 by liquid phase epitaxy. The structure comprised a (100)-oriented n-type GaAs substrate 21 doped with Si to $2 \times 10^{18} cm^{-3}$ with the following contiguous layers grown thereon in the order recited: an $Al_{0.36}Ga_{0.64}As$ layer 30 2.5 μm thick doped n-type with Te to $2 \times 10^{17} cm^{-3}$; an $Al_{0.36}Ga_{0.64}As$ layer 31 0.2 μm thick doped p-typed with Ge to $2 \times 10^{17} cm^{-3}$; an $Al_{0.08}Ga_{0.92}As$ active region 24 0.2 μm thick doped p-type with Ge to $2 \times 10^{17} cm^{-3}$; an $Al_{0.36}Ga_{0.64}As$ layer 25 1.2 μm thick doped p-type with Ge to $2 \times 10^{17} cm^{-3}$; and a GaAs layer 26 1.0 μm thick doped p-type with Ge to $2 \times 10^{18} cm^{-3}$. A stripe portion of the $p^+$-GaAs layer 26 about 12 μm wide was masked and the remainder was exposed to proton bombardment to form high resistance regions 38 and 39 extending to a depth of 2.5 μm and into part of the $p-Al_{0.36}Ga_{0.64}As$ layer 25. Electrical contacts 28 and 29 were formed by conventional means on the substrate and the final $p^+$-GaAs layer 26. The laser wafer was cleaved to a length of 380 μm to produce parallel end faces 10 and 11 to define a laser resonator.

In another illustrative embodiment, we fabricated LEDs using the layer composition and dimensions given above for the isotype laser illustrated in FIG. 3.

Figure 1:
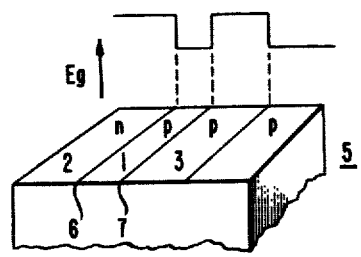
FIGS. 1 and 2 show bandgap energy diagrams and isometric views for the prior art DH structure and a structure in accordance with one embodiment of the invention, respectively.

The proton bombardment was eliminated, however. The external quantum efficiencies of these edge-emitting isotype LEDs were compared to those of similarly dimensioned $Al_xGa_{1-x}As$ DH edge-emitting LEDs illustrative of the prior art (FIG. 1). It was determined that the quantum efficiencies of the edge-emitting isotype LEDs were more than an order of magnitude greater than those of the prior art LED at current densities less than or equal to 10 amperes/cm$^2$.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, it should be noted that many other structural embodiments of the DH type lasers are possible, for example, buried heterostructures, various mesa configurations, separate confinement heterostructures, and reverse-biased blocking p-n junction double confinement heterostructures. Furthermore, the device could be fabricated from other lattice-matched material systems such as InP/GaAsInP; GaAs/AlGaAsP; GaAsSb/AlGaAsSb as described by M. B. Panish in copending application Ser. No. 921,983, now U.S. Pat. No. 4,184,471, issued on Jan. 15, 1980 and assigned to the assignee hereof.

We claim:

1. In a semiconductor light emitting diode, a semiconductor body comprising:
   an active region bounded in part by at least two isotype heterojunctions; and
   a p-n junction located entirely exterior to, and entirely noncontiguous with said active region, but adapted to inject minority carriers therein when forward biased.

2. The device of claim 1 wherein said active region is doped p-type.

3. The device of claim 1 wherein said semiconductor body is aluminum gallium arsenide.

4. The device of claim 1 wherein the distance from said p-n junction to said active region is less than the diffusion length of minority carriers.

5. The device of claim 1 wherein:
   said active region comprises $Al_yGa_{1-y}As$ ($0 \leq y \leq 0.1$);
   one of said isotype heterojunctions is an interface between said active region and a first cladding layering comprising $Al_wGa_{1-w}As$ ($0.24 \leq w \leq 0.36$); and
   the other of said isotype heterojunctions is an interface between said active region and a second cladding layer comprising $Al_zGa_{1-z}As$ ($0.24 \leq z \leq 0.36$).

6. The device of claim 5 wherein
   said p-n junction is contiguous with one of said cladding layers and is a distance in the range of about 0.2 μm to 0.3 μm from said active region.

7. The device of claim 1 wherein said active region is a stripe geometry active region, whereby said light emitting diode exhibits a reduced nonradiative interface recombination current.

8. The device of claim 1 further including electrode means attached to said body to provide said bias.

9. In a semiconductor light-emitting diode, a semiconductor body comprising:
   first and second relatively wide bandgap cladding regions,
   a relatively narrower bandgap active region bounded in part by at least first and second isotype heterojunctions formed between said active region and said first and second cladding regions, respectively, and
   a p-n junction located entirely exterior to, and entirely noncontiguous with, said active region, but adapted to inject minority carriers therein when under forward bias;
   said heterojunctions being adapted to confine said charge carriers to said active region.

* * * * *